(12) United States Patent
Lim

(10) Patent No.: US 8,173,484 B2
(45) Date of Patent: May 8, 2012

(54) METHOD OF FABRICATING SOLAR CELL USING MICROWAVE AND APPARATUS FOR THE SAME

(75) Inventor: Gun-Mook Lim, Seoul (KR)

(73) Assignee: Jusung Engineering Co., Ltd., Gwangju-si, Gyeonggi-do ( * ) Notice: Subject to any disclaimer, the term of this patent is extended or adjusted under 35 U.S.C. 154(b) by 199 days.

(21) Appl. No.: 12/671,906

(22) PCT Filed: Aug. 25, 2008

(86) PCT No.: PCT/KR2008/004936
§ 371 (c)(1),
(2), (4) Date: Feb. 2, 2010

(87) PCT Pub. No.: WO2009/028843
PCT Pub. Date: Mar. 5, 2009

(65) Prior Publication Data
US 2011/0237023 A1 Sep. 29, 2011

(30) Foreign Application Priority Data
Aug. 28, 2007 (KR) .................. 10-2007-0086653

(51) Int. Cl.
H01L 21/00 (2006.01)
(52) U.S. Cl. ......... 438/97; 438/72; 438/96; 438/E31.12; 438/E31.047; 136/258

(58) Field of Classification Search .................. 438/72, 438/96, 97; 136/258
See application file for complete search history.

(56) References Cited

U.S. PATENT DOCUMENTS
5,882,435 A 3/1999 Holdermann
2002/0164864 A1* 11/2002 Sotani ..................... 438/463

FOREIGN PATENT DOCUMENTS
CN 101017860 A 8/2007
JP 08316143 A 11/1996
JP 2005-139498 6/2005
KR 10-2006-0018033 2/2006

* cited by examiner

Primary Examiner — Dung A. Le
(74) Attorney, Agent, or Firm — Hosoon Lee

(57) ABSTRACT

A method of fabricating a solar cell includes: forming a first electrode on a substrate; forming a first impurity-doped semiconductor layer on the first electrode; forming a first intrinsic semiconductor layer of amorphous silicon on the first impurity-doped semiconductor layer; forming a second impurity-doped semiconductor layer over the first impurity-doped semiconductor layer, forming a second electrode over the second impurity-doped semiconductor layer; and irradiating a first microwave to form a second intrinsic semiconductor layer of microcrystalline silicon by crystallizing the first intrinsic semiconductor layer.

7 Claims, 5 Drawing Sheets

METHOD OF FABRICATING SOLAR CELL USING MICROWAVE AND APPARATUS FOR THE SAME

CROSS-REFERENCE TO RELATED APPLICATION

This application is a U.S. national phase application of PCT International Application PCT/KR2008/004936, filed Aug. 25, 2008, which claims priority to Korean Patent Application No. 10-2007-0086653, filed Aug. 28, 2007, the contents of which are incorporated herein by reference in their entirety.

TECHNICAL FIELD

The present invention relates to a solar cell, and more particularly, to a method of fabricating a solar cell using a microwave and an apparatus for fabricating the solar cell.

BACKGROUND ART

As concerns about clean energy such as solar power for coping with exhaust of fossil resources and environmental pollution increase, a solar cell generating an electromotive force using sunlight has been the subject of recent research.

Solar cells generate an electromotive force from diffusion of minority carriers, which are excited by sunlight, in P-N (positive-negative) junction layer. Single crystalline silicon, polycrystalline silicon, amorphous silicon or compound semiconductor may be used for the solar cells.

Although solar cells using single crystalline silicon or polycrystalline silicon have a relatively high energy-converting efficiency, solar cells using single crystalline silicon or polycrystalline silicon have a relatively high material cost and a relatively complicated fabrication process. Accordingly, a thin film type solar cell using amorphous silicon or compound semiconductor on a cheap substrate such as glass or plastic has been widely researched and developed. Specifically, a thin film type solar cell has advantages in a large-sized substrate and a flexible substrate so that a flexible large-sized solar cell can be produced.

Figure 1:
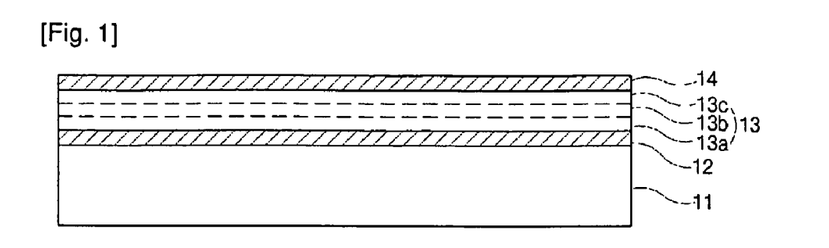
FIG. 1 is a cross-sectional view of an amorphous silicon thin film type solar cell according to the related art

FIG. 1 is a cross-sectional view of an amorphous silicon thin film type solar cell according to the related art. In FIG. 1, a first electrode 12, a semiconductor layer 13 and a second electrode 14 are sequentially formed on a substrate 11. The transparent substrate 11 includes glass or plastic. The first electrode 12 includes a transparent conductive oxide (TCO) material for transmission of incident light from the transparent substrate 11. The semiconductor layer 13 includes amorphous silicon (a-Si:H). In addition, the semiconductor layer 13 includes a p-type semiconductor layer 13a, an intrinsic semiconductor layer 13b and an n-type semiconductor layer 13c sequentially on the first electrode 12, which form a PIN (positive-intrinsic-negative) junction layer. The intrinsic semiconductor layer 13b, which may be referred to as an active layer, functions as a light absorption layer for improving efficiency of the thin film type solar cell. The second electrode 14 includes a TCO material or a metallic material such as aluminum (Al), copper (Cu) and silver (Ag).

When sunlight is irradiated onto the transparent substrate 11, minority carriers diffusing across the PIN junction layer of the semiconductor layer 13 generate a voltage difference between the first electrode 12 and the second electrode 14, thereby generating an electromotive force.

DISCLOSURE OF INVENTION

Technical Problem

The amorphous silicon thin film type solar cell has a relatively low energy-converting efficiency as compared with a single crystalline silicon solar cell or a poly-crystalline silicon solar cell. In addition, as the amorphous silicon thin film type solar cell is exposed to light for a longer time period, the efficiency is further reduced according to a property-deterioration phenomenon, which is referred to as Staebler-Wronski effect.

To solve the above problems, a thin film type solar cell using microcrystalline silicon (mc-Si:H or mc-Si:H) instead of amorphous silicon has been suggested. The micro-crystalline silicon as an intermediate material between amorphous silicon and single crystalline silicon has a grain size of several tens nano meters (nm) to several hundreds nano meters (nm). In addition, microcrystalline silicon does not have a property-deterioration phenomenon differently from amorphous silicon.

The intrinsic semiconductor layer of microcrystalline silicon has a thickness over about 2000 nm because of lower absorption coefficient of light, while the intrinsic semiconductor layer of amorphous silicon has a thickness of about 400 nm. In addition, since a deposition rate of microcrystalline silicon is lower than a deposition rate of amorphous silicon layer, thicker microcrystalline silicon is much lower productivity than thinner amorphous silicon.

For the purpose of increasing a deposition rate of microcrystalline silicon, methods of depositing microcrystalline silicon under a higher process pressure of a chamber and of depositing microcrystalline silicon using a plasma source having a higher frequency have been suggested. However, when a microcrystalline silicon layer is formed under a higher process pressure of a chamber, a contamination source such as a powder is easily generated in the chamber and a density of the microcrystalline silicon layer is reduced. In addition, when a microcrystalline silicon layer is formed using a plasma source having a higher frequency, a thickness uniformity of the microcrystalline silicon layer is degraded due to a standing wave generated at a region adjacent to a surface of the microcrystalline silicon layer. A solar cell of a tandem (double) structure or a triple structure where PIN junction layers of amorphous silicon and microcrystalline silicon are sequentially formed has the above-mentioned disadvantages.

Technical Solution

Accordingly, the present invention is directed to a method of fabricating a solar cell using a microwave and an apparatus for fabricating the solar cell that substantially obviate one or more of the problems due to limitations and disadvantages of the related art.

An object of the present invention is to provide a method of fabricating a solar cell having an improved productivity and an apparatus for fabricating the solar cell.

Another object of the present invention is to provide a method of forming a micro-crystalline silicon layer with a reduced process time.

A method of fabricating a solar cell includes: forming a first electrode on a substrate; forming a first impurity-doped semiconductor layer on the first electrode; forming a first intrinsic semiconductor layer of amorphous silicon on the first impurity-doped semiconductor layer; forming a second impurity-doped semiconductor layer over the first impurity-doped semiconductor layer; forming a second electrode over the second impurity-doped semiconductor layer; and irradiating a first microwave to form a second intrinsic semiconductor layer of microcrystalline silicon by crystallizing the first intrinsic semiconductor layer.

In another aspect, a method of fabricating a solar cell includes: forming a first electrode on a substrate; forming a first impurity-doped semiconductor layer on the first electrode; forming a first intrinsic semiconductor layer of microcrystalline silicon having a first crystallinity on the first impurity-doped semiconductor layer; forming a second impurity-doped semiconductor layer over the first impurity-doped semiconductor layer; forming a second electrode over the second impurity-doped semiconductor layer; and irradiating a first microwave to form a second intrinsic semiconductor layer of microcrystalline silicon having a second crystallinity greater than the first crystallinity by crystallizing the first intrinsic semiconductor layer.

In another aspect, a method of fabricating a solar cell includes: forming a first electrode on a substrate; forming a first impurity-doped semiconductor layer on the first electrode; forming a first intrinsic semiconductor layer of amorphous silicon on the first impurity-doped semiconductor layer; irradiating a first microwave to form a second intrinsic semiconductor layer of microcrystalline silicon having a first crystallinity by crystallizing the first intrinsic semiconductor layer; forming a third intrinsic semiconductor layer of amorphous silicon on the second intrinsic semiconductor layer; irradiating a second microwave to form a fourth intrinsic semiconductor layer of microcrystalline silicon having a second crystallinity greater than the first crystallinity by crystallizing the third intrinsic semiconductor layer; forming a second impurity-doped semiconductor layer on the fourth intrinsic semiconductor layer; and forming a second electrode on the second impurity-doped semiconductor layer.

In another aspect, an apparatus for fabricating a solar includes: a chamber having a reaction space; a supporting unit in the chamber, wherein a substrate is loaded on the supporting unit; a microwave generating unit moving over the supporting unit; and a driving unit moving the microwave generating unit.

Advantageous Effects

In a method of fabricating a solar cell according to an embodiment of the present invention, after an intrinsic semiconductor layer of amorphous silicon or micro-crystalline is formed with a relatively high deposition rate, the intrinsic semiconductor layer is crystallized by irradiation of microwave. Accordingly, an intrinsic semiconductor layer of microcrystalline silicon having relatively high crystallinity is formed in a reduced process time and a solar cell is fabricated with an improved productivity.

BRIEF DESCRIPTION OF THE DRAWINGS

The accompanying drawings, which are included to provide a further understanding of the invention and are incorporated in and constitute a part of this specification, illustrate embodiments of the invention.

MODE FOR THE INVENTION

Reference will now be made in detail to embodiments which are illustrated in the accompanying drawings. Wherever possible, similar reference numbers will be used to refer to the same or similar parts.

For the purpose of increasing a deposition rate of microcrystalline silicon, after a first semiconductor layer of amorphous silicon is formed with a relatively higher deposition rate, the first semiconductor layer of amorphous silicon is crystallized using a microwave to form a second semiconductor layer of microcrystalline silicon. Alternatively, after a first semiconductor layer of microcrystalline silicon having a lower crystallinity is formed with a relatively higher deposition rate, the first semiconductor layer of microcrystalline silicon is re-crystallized using a microwave to form a second semiconductor layer of microcrystalline silicon having a higher crystallinity.

Figure 2:
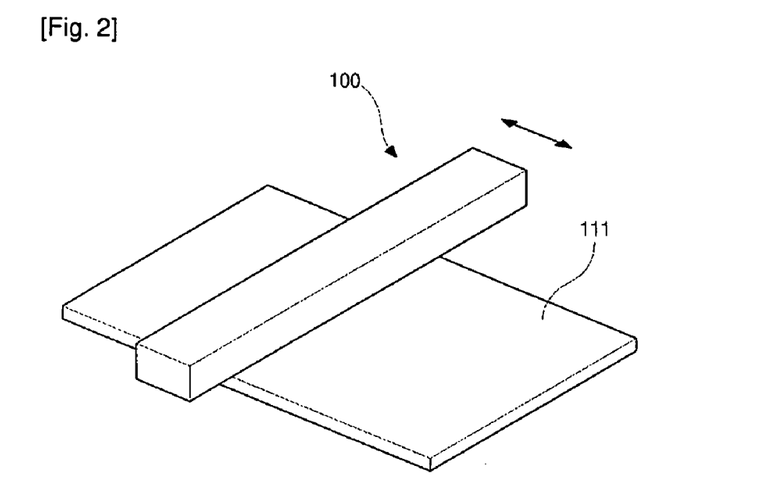
FIG. 2 is a perspective view showing a method of processing a substrate using a microwave generating unit of an apparatus according to an embodiment of the present invention.
Figure 3:
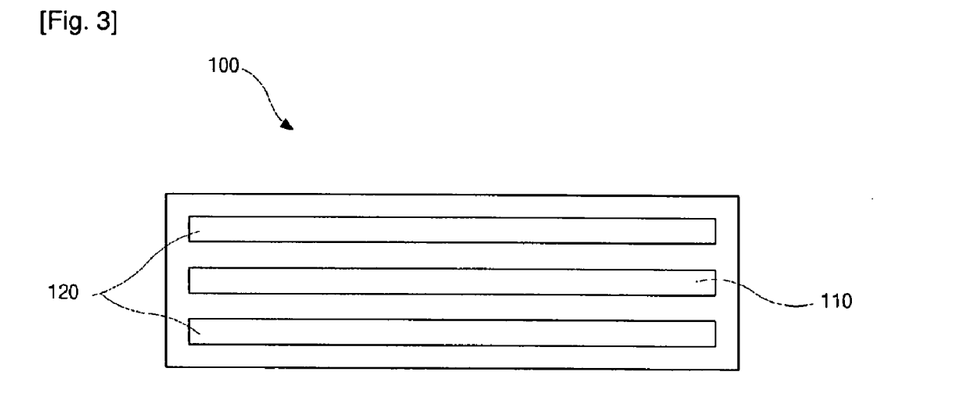
FIG. 3 is a plan view showing a microwave generating unit of an apparatus according to an embodiment of the present invention.

FIG. 2 is a perspective view showing a method of processing a substrate using a microwave generating unit of an apparatus according to an embodiment of the present invention, and FIG. 3 is a plan view showing a microwave generating unit of an apparatus according to an embodiment of the present invention.

In FIG. 2, a microwave generating unit 100 is disposed to move over a substrate 111 having a first semiconductor layer (not shown) of amorphous silicon, and a microwave from the microwave generating unit 100 is applied to the first semiconductor layer. The frequency of the microwave, which is within a range from several hundreds MHz to several hundreds GHz, is determined on the basis of fabrication condition and thin film property. For example, the microwave generating unit 100 may generate a microwave having a frequency of about 2.54 GHz. A distance between the microwave generating unit 100 and the first semiconductor layer of the substrate 111 is determined on the basis of a desired crystallinity. For example, the distance between the microwave generating unit 100 and the first semiconductor layer of the substrate 111 may be smaller than about 100 mm.

In addition, as shown in FIG. 3, the microwave generating unit 100 may include a microwave generating part 110 and a heating part 120. The heating part 120 may include one of an infrared (IR) lamp, a halogen lamp, an ultraviolet (UV) lamp, a xenon lamp and a heating resistor.

Figure 4:
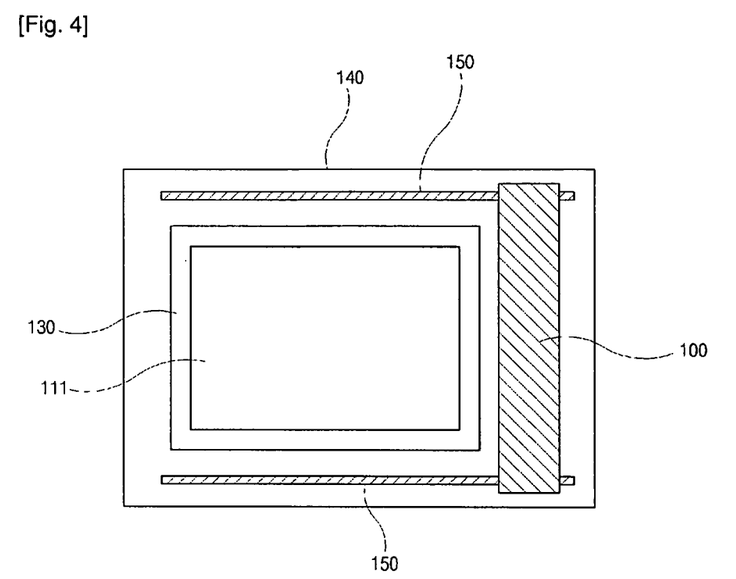
FIGS. 4 and 5 are a plan view and a cross-sectional view showing an apparatus according to an embodiment of the present invention.
Figure 5:
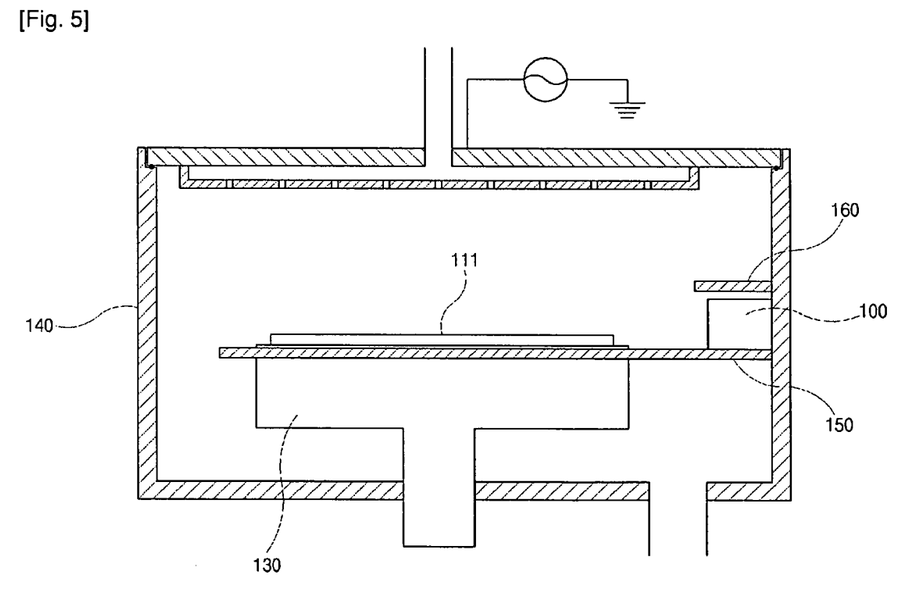
Figure 6:
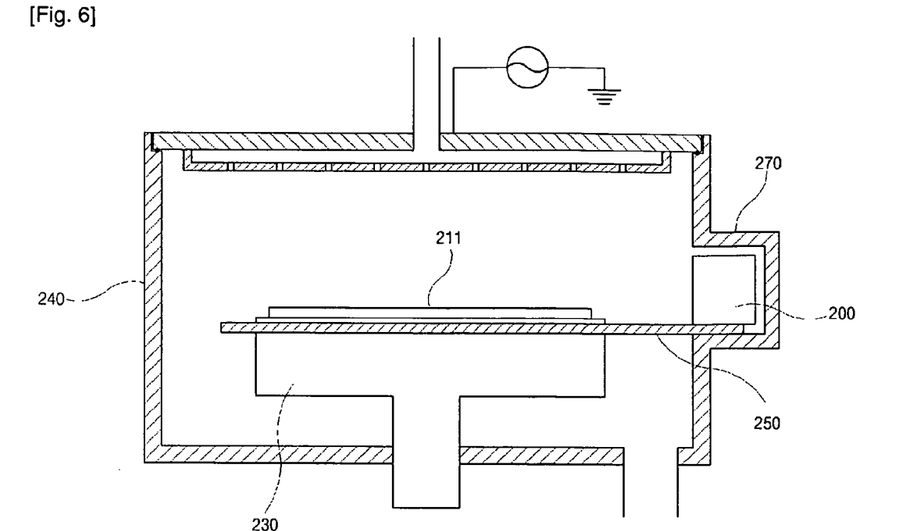
FIG. 6 is a cross-sectional view showing an apparatus according to another embodiment of the present invention.

FIGS. 4 and 5 are a plan view and a cross-sectional view showing an apparatus according to an embodiment of the present invention, and FIG. 6 is a cross-sectional view showing an apparatus according to another embodiment of the present invention.

In FIGS. 4 and 5, a microwave generating unit 100 is disposed in a chamber 140 of an apparatus for fabricating a solar cell. The apparatus further includes a supporting unit 130, e.g., a susceptor, where a substrate 111 is loaded and a driving unit (not shown) including a guide rail 150 for the microwave generating unit 100. The microwave generating unit 100 horizontally moves over the substrate 111 on the supporting unit 130 along the guide rail 150 according to a control signal from a control unit (not shown) of the apparatus. The guide rail 150 parallel to at least one side of the supporting unit 130 provides a moving path for the microwave generating unit 100. The guide rail 150 may be formed separately from the supporting unit 130. Alternatively, the guide rail 150 may be integrated with a side surface or a top surface of the supporting unit 130 or be detachably combined with the supporting unit 130. Further, the guide rail may be combined with an inner sidewall of the chamber 140. In addition, since the microwave generating unit 100 horizontally moves in the chamber 140, a power for the microwave generating part 110 (of FIG. 3) and the heating part 120 (of FIG. 3) may be supplied through the guide rail 150 from a power source (not shown).

While a thin film is formed on the substrate 111 using plasma, the microwave generating unit 100 is disposed out of the supporting unit 130 to expose the substrate 111 to the plasma. In addition, the microwave generating unit 100 is disposed such that an influence on the plasma by the microwave generating unit 100 is prevented and the microwave generating unit 100 is protected from the plasma. Accordingly, as shown in FIG. 5, a shielding unit 160 may be formed in the chamber 140 to cover and separate the microwave generating unit 100 from a reaction space of the chamber 140. Alternatively, as shown in FIG. 6, the chamber 240 may include a concave portion 270 protruding from the sidewall of the chamber 240 and the guide rail 250 may extend to the concave portion 270 so that the microwave generating unit 200 can be accommodated by the concave portion 270 during the process of forming the thin film.

FIGS. 7 to 11 are cross-sectional views showing a method of fabricating a solar cell according to an embodiment of the present invention.

Figure 7:
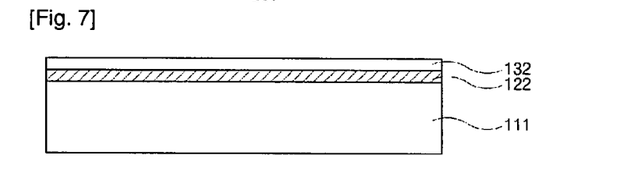
FIGS. 7 to 11 are cross-sectional views showing a method of fabricating a solar cell according to an embodiment of the present invention.

In FIG. 7, a first electrode 122 (e.g., a front electrode) and a first impurity-doped semiconductor layer 132 (e.g., a p-type semiconductor layer) are sequentially formed on a substrate 111. The first electrode 122 includes a transparent conductive material for transmission of incident light through the substrate 111, and the first impurity-doped semiconductor layer 132 includes one of amorphous silicon (a-Si:H) and microcrystalline silicon (mc-Si:H).

Figure 8:
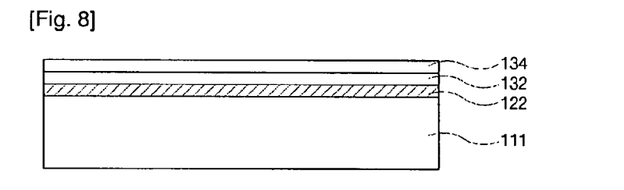

In FIG. 8, a first intrinsic semiconductor layer 134 of amorphous silicon is formed on the first impurity-doped semiconductor layer 132. The first intrinsic semiconductor layer 134 may be formed in a chamber 140 (of FIGS. 4 and 5) using a plasma generated by applying a high frequency power to gas mixture of silane ($SiH_4$) and hydrogen ($H_2$) having a ratio smaller than about 1:10.

Figure 9:
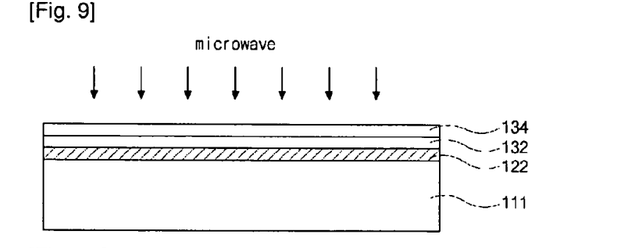

In FIG. 9, a microwave generating unit 100 (of FIGS. 4 and 5) moves along a guide rail 150 (of FIGS. 4 and 5) to be disposed over the first intrinsic semiconductor layer 134. Next, a microwave from the microwave generating unit 100 is irradiated onto the first intrinsic semiconductor layer 134.

Figure 10:
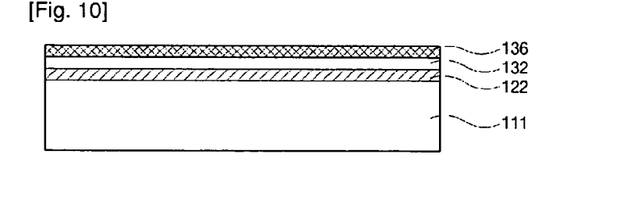

In FIG. 10, the first intrinsic semiconductor layer 134 of amorphous silicon is crystallized by irradiation of the microwave to become a second intrinsic semiconductor layer 136 of microcrystalline silicon. The irradiation condition such as a frequency of the microwave and a process time may be determined on the basis of a crystallinity of the second intrinsic semiconductor layer 136.

Figure 11:
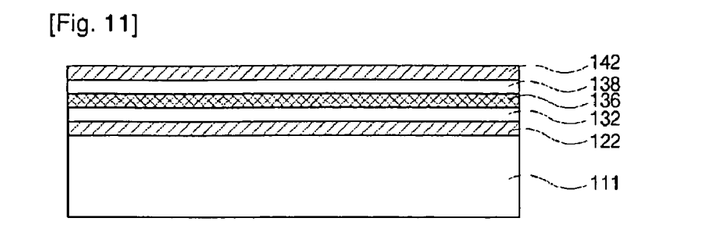

In FIG. 11, a second impurity-doped semiconductor layer 138 (e.g., an n-type semiconductor layer) and a second electrode 142 (e.g., a rear electrode) are sequentially formed on the second intrinsic semiconductor layer 136.

In another embodiment, the microwave may be irradiated onto the second impurity-doped semiconductor layer to crystallize the first intrinsic semiconductor layer under the second impurity-doped semiconductor layer. FIGS. 12 to 15 are cross-sectional views showing a method of fabricating a solar cell according to another embodiment of the present invention.

Figure 12:
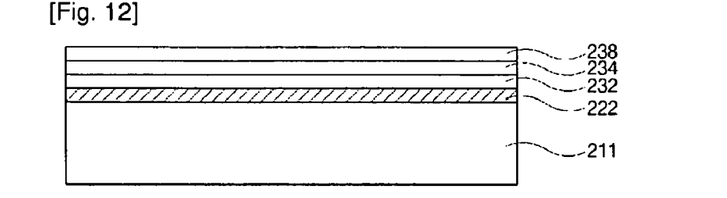
FIGS. 12 to 15 are cross-sectional views showing a method of fabricating a solar cell according to another embodiment of the present invention.

In FIG. 12, a first electrode 222, a first impurity-doped semiconductor layer 232 (e.g., a p-type semiconductor layer), a first intrinsic semiconductor layer 234 of amorphous silicon and a second impurity-doped semiconductor layer 238 (e.g., an n-type semiconductor layer) are sequentially formed on a substrate 211. The first electrode 222 includes a transparent conductive material for transmission of incident light through the substrate 211. In addition, the first and second impurity-doped semiconductor layers 232 and 238 may include one of amorphous silicon (a-Si:H) and microcrystalline silicon (mc-Si:H). The first intrinsic semiconductor layer 234 may be formed in a chamber 140 (of FIGS. 4 and 5) using a plasma generated by applying a high frequency power to gas mixture of silane ($SiH_4$) and hydrogen ($H_2$) having a ratio smaller than about 1:10.

Figure 13:
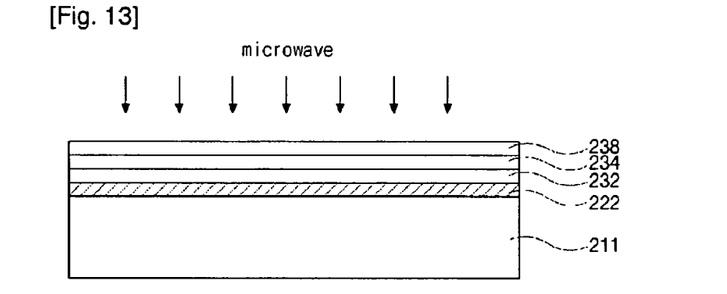

In FIG. 13, a microwave generating unit 100 (of FIGS. 4 and 5) moves along a guide rail 150 (of FIGS. 4 and 5) to be disposed over the second impurity-doped semiconductor layer 238. Next, a microwave from the microwave generating unit 100 is irradiated onto the second impurity-doped semiconductor layer 238.

Figure 14:
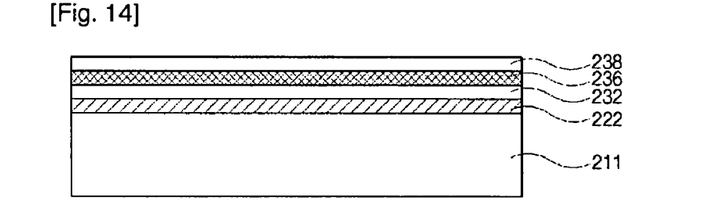
Figure 15:
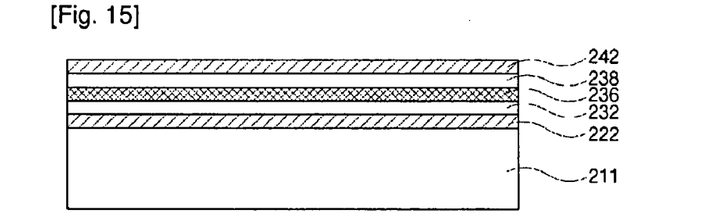

In FIG. 14, the first intrinsic semiconductor layer 234 of amorphous silicon under the second impurity-doped semiconductor layer 238 is crystallized by irradiation of the microwave to become a second intrinsic semiconductor layer 236 of microcrystalline silicon. The irradiation condition such as a frequency of the microwave and a process time may be determined on the basis of a crystallinity of the second intrinsic semiconductor layer 236. Since the microwave is irradiated after a semiconductor material is deposited, the microwave may be irradiated onto the second impurity-doped semiconductor layer 238 in an atmospheric ambient or an inert gas ambient for preventing contamination.

In FIG. 8E, a second electrode 242 (e.g., a rear electrode) is formed on the second intrinsic semiconductor layer 236.

The method of fabricating a solar cell according to the present invention may be applied to a tandem (double) structure solar cell or a triple structure solar cell where PIN junction layers of amorphous silicon and microcrystalline silicon are sequentially formed. Accordingly, a crystallization step using microwave may be performed after a first intrinsic semiconductor layer of amorphous silicon is formed or after a set of PIN junction layers is formed. Alternatively, a crystallization step using microwave may be performed after at least two sets of PIN junction layers are formed, thereby crystallizing first intrinsic semiconductor layers of the at least two sets of PIN junction layers.

Specifically, when the heat from the heating part 120 (of FIG. 3) is supplied to the substrate simultaneously with the microwave, the temperature range of the heating part 120 is controlled to prevent diffusion of impurities in the first and second impurity-doped semiconductor layers. For example, the heat and the microwave are supplied to the first intrinsic semiconductor layer 134 (of FIG. 9), the temperature of the heating part 120 may be controlled to prevent diffusion of the impurities of the first impurity-doped semiconductor layer 132 (of FIG. 9) into the first intrinsic semiconductor layer 134. In addition, the heat and the microwave are supplied to the second impurity-doped semiconductor layer 238 (of FIG. 13), the temperature of the heating part 120 may be controlled to prevent diffusion of the impurities of the first and second impurity-doped semiconductor layers 232 and 238 (of FIG. 13) into the first intrinsic semiconductor layer 234 (of FIG. 13).

For the purpose of improving a light absorption rate, a plurality of layers corresponding to a plurality of band gaps may be formed on a first impurity-doped semiconductor layer. Since amorphous silicon absorbs light having a shorter wavelength mostly of about 300 nm to about 800 nm and microcrystalline silicon absorbs light having a longer wavelength mostly of about 500 nm to about 1100 nm, the first and second intrinsic semiconductor layers having a wide band light absorption property may be obtained by partial crystallization of the first intrinsic semiconductor layer of amorphous silicon. FIGS. 16 to 20 are cross-sectional views showing a method of fabricating a solar cell according to another embodiment of the present invention.

Figure 16:
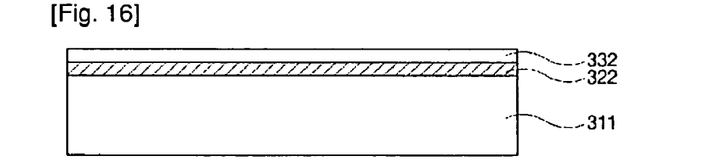
FIGS. 16 to 20 are cross-sectional views showing a method of fabricating a solar cell according to another embodiment of the present invention.

In FIG. 16, a first electrode 322 (e.g., a front electrode) and a first impurity-doped semiconductor layer 332 (e.g., a p-type semiconductor layer) are sequentially formed on a substrate 311. The first electrode 322 includes a transparent conductive material for transmission of incident light through the substrate 311, and the first impurity-doped semiconductor layer 332 includes one of amorphous silicon (a-Si:H) and microcrystalline silicon (mc-Si:H).

Figure 17:
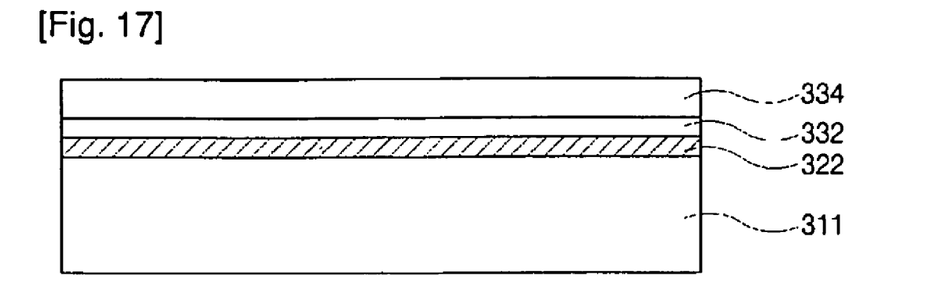

In FIG. 17, a first intrinsic semiconductor layer 334 of amorphous silicon is formed on the first impurity-doped semiconductor layer 332. The first intrinsic semiconductor layer 334 may be formed in a chamber 340 (of FIGS. 4 and 5) using a plasma generated by applying a high frequency power to gas mixture of silane ($SiH_4$) and hydrogen ($H_2$) having a ratio smaller than about 1:10. Further, the first intrinsic semiconductor layer 334 may have a relatively thick thickness for a subsequent partial crystallization process.

Figure 18:
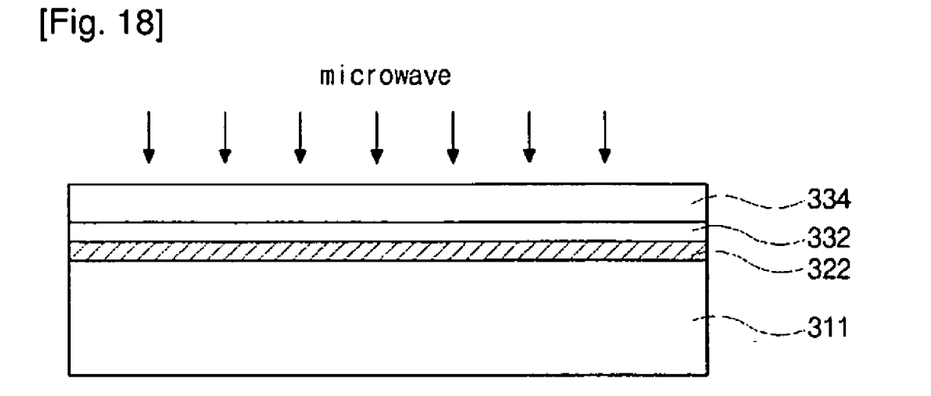

In FIG. 18, a microwave generating unit 100 (of FIGS. 4 and 5) moves along a guide rail 150 (of FIGS. 4 and 5) to be disposed over the first intrinsic semiconductor layer 334. Next, a microwave from the microwave generating unit 100 is irradiated onto the first intrinsic semiconductor layer 334. Here, the irradiation condition such as an irradiation time and an irradiation intensity of the microwave may be adjusted to prevent a crystallization of the whole volume of the first intrinsic semiconductor layer 334.

Figure 19:
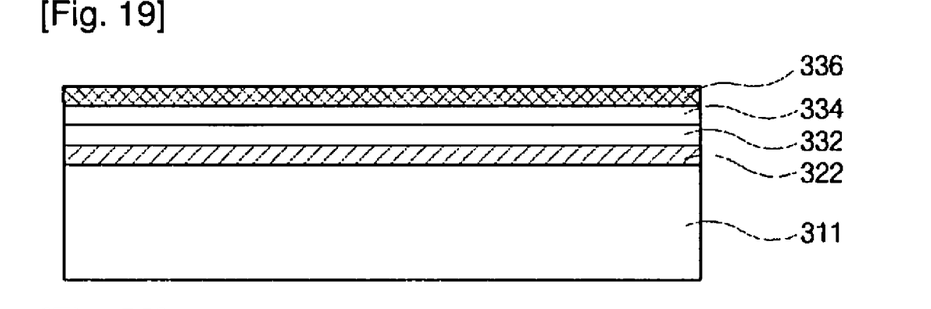

In FIG. 19, an upper portion of the first intrinsic semiconductor layer 334 of amorphous silicon is crystallized by irradiation of the microwave to become a second intrinsic semiconductor layer 336 of microcrystalline silicon and a lower portion of the first intrinsic semiconductor layer 334 of amorphous silicon remains without crystallization. As a result, the first intrinsic semiconductor layer 334 of amorphous silicon and the second intrinsic semiconductor layer 336 of microcrystalline silicon are sequentially formed on the first impurity-doped semiconductor layer 332.

Figure 20:
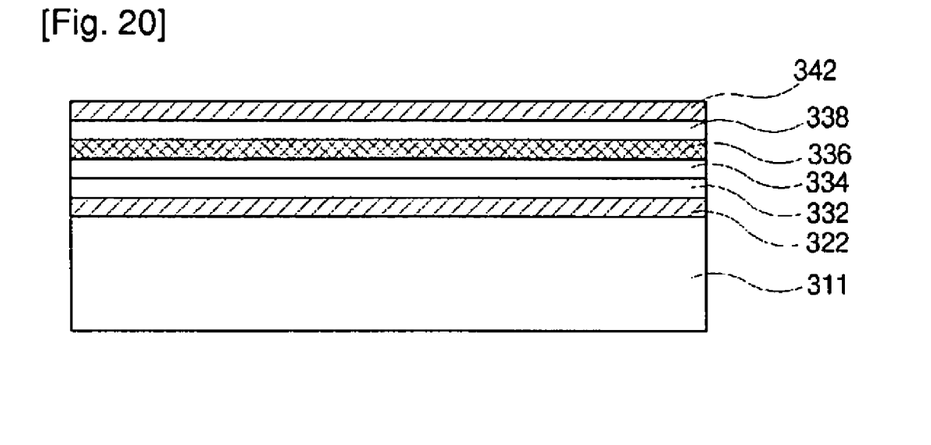

In FIG. 20, a second impurity-doped semiconductor layer 338 (e.g., an n-type semiconductor layer) and a second electrode 342 (e.g., a rear electrode) are sequentially formed on the second intrinsic semiconductor layer 336.

In another embodiment, a plurality of layers including microcrystalline silicon and having different crystallinities may be formed on a first impurity-doped semiconductor layer for improving a light absorption rate. For example, after a first intrinsic semiconductor layer of amorphous silicon is formed on a first impurity-doped semiconductor layer, the first intrinsic semiconductor layer of amorphous silicon is crystallized by irradiating microwave to become a second intrinsic semiconductor layer of microcrystalline silicon having a first crystallinity. Next, after a third intrinsic semiconductor layer of amorphous silicon is formed on the second intrinsic semiconductor layer of microcrystalline silicon, the third semiconductor layer of amorphous silicon is crystallized by irradiating microwave to become a fourth intrinsic semiconductor layer of microcrystalline silicon having a second crystallinity different from the first crystallinity. As a result, the second intrinsic semiconductor layer of microcrystalline silicon and the fourth intrinsic semiconductor layer including microcrystalline silicon are formed on the first impurity-doped semiconductor layer. In addition, the second crystallinity of the fourth intrinsic semiconductor layer, i.e., an upper layer may be greater than the first crystallinity of the second intrinsic semiconductor layer, i.e., a lower layer such light absorbed by the fourth intrinsic semiconductor layer has a longer wavelength than light absorbed by the second intrinsic semiconductor layer.

In another embodiment, after a first intrinsic semiconductor layer of microcrystalline silicon having a first crystallinity is formed on a first impurity-doped semiconductor layer with a relatively high deposition rate, the first semiconductor layer of microcrystalline silicon may be re-crystallized by irradiating microwave to become a second intrinsic semiconductor layer of microcrystalline silicon having a second crystallinity greater than the first crystallinity. As a ratio of hydrogen (H2) decreases, a deposition rate increases and a crystallinity decreases. Since an amorphous silicon thin film is obtained by using a gas mixture of silane ($SiH_4$) and hydrogen ($H_2$) having a ratio smaller than about 1:10 and a microcrystalline silicon thin film is obtained by using a gas mixture of silane ($SiH_4$) and hydrogen ($H_2$) having a ratio greater than about 1:10, the first intrinsic semiconductor layer of microcrystalline silicon having the first crystallinity may be obtained with a relatively high deposition rate by using a gas mixture of silane ($SiH_4$) and hydrogen ($H_2$) having a ratio of about 1:10. After the first intrinsic semiconductor layer of microcrystalline silicon is formed, the first crystallinity may be increased by irradiation of microwave to be the second crystallinity. In addition, the microwave may be irradiated onto the first intrinsic semiconductor layer of micro-crystalline silicon. Alternatively, the microwave may be irradiated onto a top surface of laminated layers after one set of PIN junction layers is formed, or after at least two sets of PIN junction layers.

It will be apparent to those skilled in the art that various modifications and variations can be made in a method of fabricating a solar cell using a microwave and an apparatus for fabricating the solar cell of the present invention without departing from the spirit or scope of the invention. Thus, it is intended that the present invention cover the modifications and variations of this invention provided they come within the scope of the appended claims and their equivalents.

The invention claimed is:

1. A method of fabricating a solar cell, comprising:
    forming a first electrode on a substrate;
    forming a first impurity-doped semiconductor layer on the first electrode;
    forming a first intrinsic semiconductor layer of amorphous silicon on the first impurity-doped semiconductor layer;
    forming a second impurity-doped semiconductor layer over the first impurity-doped semiconductor layer;
    forming a second electrode over the second impurity-doped semiconductor layer; and
    irradiating a first microwave to form a second intrinsic semiconductor layer of microcrystalline silicon by crystallizing the first intrinsic semiconductor layer, wherein irradiating the first microwave is performed directly after forming the first intrinsic semiconductor layer.

2. The method according to claim 1, further comprising:
forming a third impurity-doped semiconductor layer on the second impurity-doped semiconductor layer;
forming a third intrinsic semiconductor layer of amorphous silicon on the third impurity-doped semiconductor layer;
forming a fourth impurity-doped semiconductor layer over the third impurity-doped semiconductor layer; and
irradiating a second microwave directly after forming the third intrinsic semiconductor layer to form a fourth intrinsic semiconductor layer of microcrystalline silicon by crystallizing the third intrinsic semiconductor layer.

3. The method according to claim 1, wherein an upper portion of the first intrinsic semiconductor layer is crystallized to become the second intrinsic semiconductor layer and a lower portion of the first intrinsic semiconductor layer remains without crystallization.

4. The method according to claim 1, wherein irradiating the first microwave includes heating the substrate using a heating part.

5. A method of fabricating a solar cell, comprising:
forming a first electrode on a substrate;
forming a first impurity-doped semiconductor layer on the first electrode;
forming a first intrinsic semiconductor layer of microcrystalline silicon having a first crystallinity on the first impurity-doped semiconductor layer;
forming a second impurity-doped semiconductor layer over the first impurity-doped semiconductor layer;
forming a second electrode over the second impurity-doped semiconductor layer; and
irradiating a first microwave to form a second intrinsic semiconductor layer of microcrystalline silicon having a second crystallinity greater than the first crystallinity by crystallizing the first intrinsic semiconductor layer, wherein irradiating the first microwave is performed directly after forming the first intrinsic semiconductor layer.

6. The method according to claim 5, wherein irradiating the first microwave is performed directly after forming the first intrinsic semiconductor layer.

7. A method of fabricating a solar cell, comprising:
forming a first electrode on a substrate;
forming a first impurity-doped semiconductor layer on the first electrode;
forming a first intrinsic semiconductor layer of amorphous silicon on the first impurity-doped semiconductor layer;
irradiating a first microwave to form a second intrinsic semiconductor layer of microcrystalline silicon having a first crystallinity by crystallizing the first intrinsic semiconductor layer,
wherein irradiating the first microwave is performed directly after forming the first intrinsic semiconductor layer.
forming a third intrinsic semiconductor layer of amorphous silicon on the second intrinsic semiconductor layer;
irradiating a second microwave to form a fourth intrinsic semiconductor layer of microcrystalline silicon having a second crystallinity greater than the first crystallinity by crystallizing the third intrinsic semiconductor layer;
forming a second impurity-doped semiconductor layer on the fourth intrinsic semiconductor layer; and
forming a second electrode on the second impurity-doped semiconductor layer.

* * * * *